United States Patent
Chang et al.

(10) Patent No.: US 9,299,607 B2
(45) Date of Patent: Mar. 29, 2016

(54) CONTACT CRITICAL DIMENSION CONTROL

(71) Applicant: Taiwan Semiconductor Manufacturing CO., LTD., Hsinchu (TW)

(72) Inventors: Tain-Shang Chang, Tainan (TW); Chia-Han Lai, Zhubei (TW); Ren-Hau Yu, Kaohsiung (TW); Ching-Yao Sun, Kaohsiung (TW); Yu-Sheng Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 30 days.

(21) Appl. No.: 14/179,671

(22) Filed: Feb. 13, 2014

(65) Prior Publication Data
US 2015/0228537 A1    Aug. 13, 2015

(51) Int. Cl.
*H01L 21/4763* (2006.01)
*H01L 21/768* (2006.01)
*H01L 21/3205* (2006.01)
*H01L 21/311* (2006.01)

(52) U.S. Cl.
CPC .... *H01L 21/76879* (2013.01); *H01L 21/31116* (2013.01); *H01L 21/32053* (2013.01); *H01L 21/76831* (2013.01)

(58) Field of Classification Search
CPC ................... H01L 21/28518; H01L 21/76843; H01L 21/76897; H01L 29/665
USPC ................................................... 438/630, 649
See application file for complete search history.

(56) References Cited

U.S. PATENT DOCUMENTS

| | | | |
|---|---|---|---|
| 6,174,791 B1* | 1/2001 | Lin et al. | 438/528 |
| 2004/0038517 A1* | 2/2004 | Kang et al. | 438/630 |
| 2005/0280040 A1* | 12/2005 | Kasko et al. | 257/213 |
| 2007/0296008 A1* | 12/2007 | Natori | 257/295 |
| 2011/0215477 A1* | 9/2011 | Chen et al. | 257/773 |
| 2014/0361381 A1* | 12/2014 | Hung et al. | 257/384 |

* cited by examiner

*Primary Examiner* — Hoai V Pham (57) ABSTRACT

In a method for manufacturing a semiconductor device, a dielectric layer is formed on a substrate, and a contact hole is formed from the dielectric layer to the substrate. A dielectric spacer liner is formed to cover a sidewall and a bottom of the contact hole. A portion of the dielectric spacer liner is removed to expose a portion of the substrate. A metal silicide layer is formed into the substrate through the contact hole.

20 Claims, 5 Drawing Sheets

CONTACT CRITICAL DIMENSION CONTROL

BACKGROUND

In a semiconductor device, a contact hole is used to form an electrical connection between a contact region in a substrate and an associated contact. One approach to form the contact region into the substrate is to perform a silicidation process through the contact hole. However, as semiconductor devices continue to be scaled down, a critical dimension (CD) of each contact region is increasingly shrunk, and undesired effects such as encroachments may occur at the contact regions during the silicidation process. Accordingly, it is more and more difficult to form a contact region into a predetermined portion of the substrate by the silicidation process through the contact hole.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a conventional process for forming a contact region into a substrate of a semiconductor device, a contact hole is formed in a dielectric layer covering the substrate to expose a portion of the substrate, an implant region is formed in the portion of the substrate through the contact hole, and a silicidation process is performed on the implant region to form the contact region in the portion of the substrate. In the operation of forming the implant region, a range of the contact region, which is a range of the implant region, is defined. However, due to an encroachment effect, a critical dimension of the contact region becomes larger in the silicidation process. Therefore, as the semiconductor devices keep shrinking, it is more and more difficult to form a contact region with a predetermined critical dimension.

Embodiments of the present disclosure are directed to providing a semiconductor device and a method for manufacturing the semiconductor device, in which a contact region including a metal silicide layer is formed under critical dimension control. The semiconductor device is manufactured to include the metal silicide layer with a small critical dimension by forming a dielectric spacer liner. In the semiconductor device, the dielectric spacer liner covers a sidewall of a contact hole so as to shrink a bottom of the contact hole and to prevent damage caused during a silicidation process, so that the metal silicide layer with the shrunk critical dimension can be formed into a substrate.

Figure 1:
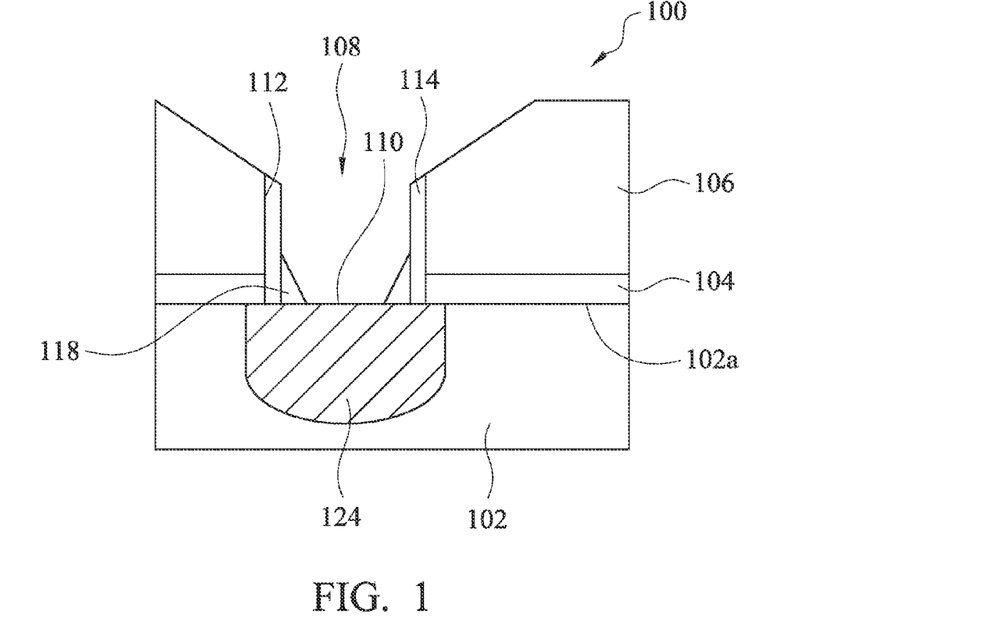
FIG. 1 is schematic cross-sectional view of a semiconductor device in accordance with various embodiments.

FIG. 1 is schematic cross-sectional view of a semiconductor device in accordance with various embodiments. As shown in FIG. 1, a semiconductor device 100 includes a substrate 102, a dielectric layer 104, a dielectric spacer liner 114 and a metal silicide layer 124. In the embodiments, the substrate 102 is a silicon substrate.

In some embodiments, the dielectric layer 104 is disposed on the substrate 102 and covers a surface 102a of the substrate 102. In certain embodiments, as shown in FIG. 1, the semiconductor device 100 optionally includes an etch stop layer 104 covering the surface 102a of the substrate 102. In the embodiment including the etch stop layer 104 disposed on the surface 102a of the substrate 102, the dielectric layer 106 is formed to cover the etch stop layer 104. In addition, the etch stop layer 104 and the dielectric layer 106 are formed from different materials. For example, the etch stop layer 104 is formed from silicon nitride or silicon oxynitride, and the dielectric layer 106 is formed from silicon oxide.

A contact hole 108 is formed in the dielectric layer 106, and a bottom 110 of the contact hole 108 exposes a portion of the surface 102a of the substrate 102, i.e. the contact hole 108 penetrates through the dielectric layer 106 to the substrate 102. As shown in FIG. 1, in the embodiment including the etch stop layer 104 formed on the substrate 102, the contact hole 108 is formed from the dielectric layer 106 through the etch stop layer 104 to the substrate 102.

The dielectric spacer liner 114 covers a sidewall 112 of the contact hole 108. In some embodiments, the dielectric spacer liner 114 is formed from an oxide containing carbon. In exemplary examples, the dielectric spacer liner 114 is formed from silicon oxycarbide (SiOC). The dielectric spacer liner 114 covering the sidewall 112 of the contact hole 108 can protect the sidewall 112 of the contact hole 108 during the subsequent processes, and can shrink the bottom 110 of the contact hole 108.

In certain embodiments, as shown in FIG. 1, the semiconductor device 100 further includes a dielectric spacer 118 disposed on the dielectric spacer liner 114 covering the sidewall 112 adjacent to the bottom 110 of the contact hole 108. In exemplary examples, the dielectric spacer 118 and the dielectric spacer liner 114 are formed from the same material. The dielectric spacer 118 on the dielectric spacer liner 114 covering the sidewall 112 adjacent to the bottom 110 can further shrink the bottom 110 of the contact hole 108.

The metal silicide layer 124 is formed into the exposed portion of the substrate 102 through the contact hole 108 by using a silicidation operation. In certain embodiments, the metal silicide layer 124 is formed from nickel silicide. During the silicidation operation for forming the metal silicide layer 124, because the dielectric spacer liner 114 covers the sidewall 112 of the contact hole 108, or the dielectric spacer liner 114 covers the sidewall 112 and the dielectric spacer 118 disposed on the dielectric spacer liner 114 covering the sidewall 112 adjacent to the bottom 110, the encroachment effect of the silicidation operation can be restrained. Thus, the critical dimension of the metal silicide layer 124 can be controlled and shrunk.

Figure 2A:
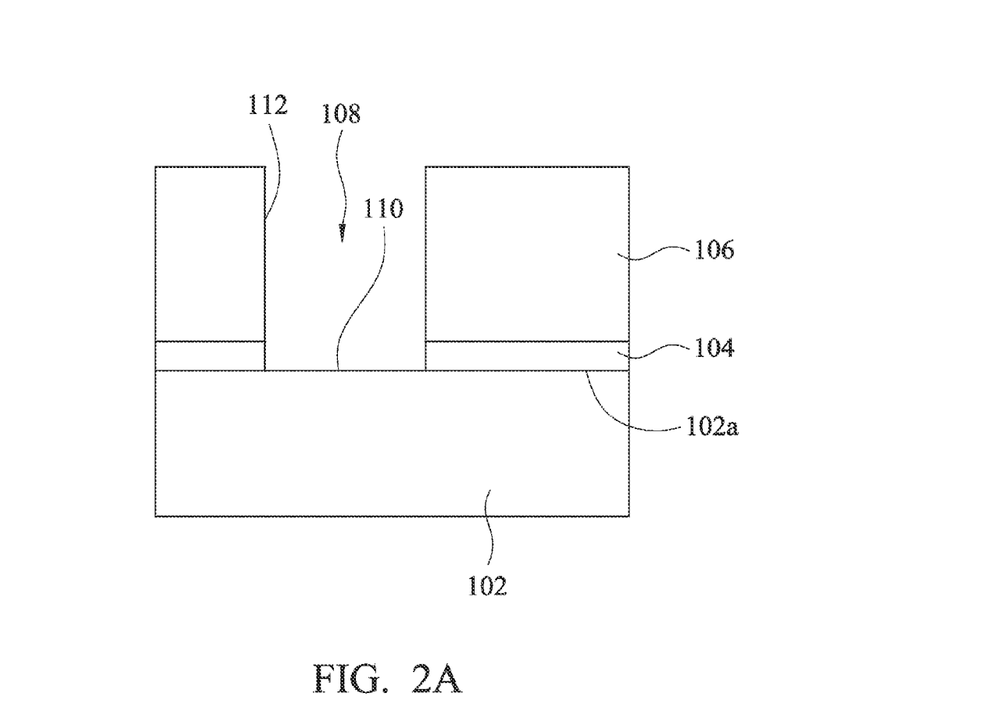
FIG. 2A through FIG. 2E are schematic cross-sectional views of intermediate stages showing a method for manufacturing a semiconductor device in accordance with various embodiments.

Referring to FIG. 2A through FIG. 2E, FIG. 2A through FIG. 2E are schematic cross-sectional views of intermediate stages showing a method for manufacturing a semiconductor device in accordance with various embodiments. As shown in FIG. 2A, a substrate 102 is provided. The substrate 102 is a silicon substrate for a subsequent silicidation process.

In some embodiments, a dielectric layer 106 is deposited to cover a surface 102a of the substrate 102. For example, the dielectric layer 106 is formed by using a chemical vapor deposition (CVD) technique, such as a plasma enhanced CVD (PECVD) technique. In certain embodiments, as shown in FIG. 2A, an etch stop layer 104 is optionally formed to cover the surface 102a of the substrate 102. In a subsequent etching process of the dielectric layer 106, the etching process can be stopped or slowed down by the etch stop layer 104, thereby preventing the substrate 102 from being over etched.

In the embodiment including the etch stop layer 104 formed on the surface 102a of the substrate 102, the dielectric layer 106 is formed to cover the etch stop layer 104. The etch stop layer 104 is used to provide a stop during the subsequent etching process of the dielectric layer 106, so that the etch stop layer 104 and the dielectric layer 106 are formed from different materials. For example, the etch stop layer 104 is formed from silicon nitride or silicon oxynitride, and the dielectric layer 106 is formed from silicon oxide.

After the dielectric layer 106 is formed, a contact hole 108 is formed into the dielectric layer 106 to expose a portion of the surface 102a of the substrate 102, i.e. the contact hole 108 is formed from the dielectric layer 106 to the substrate 102. The contact hole 108 formed in the dielectric layer 106 has a bottom 110 and a sidewall 112, and the bottom 110 exposes the portion of the surface 102a. In some embodiments, the contact hole 108 is formed using a photolithography process and an etching process. For example, a patterned photoresist layer is formed on the dielectric layer 106 in the photolithography process to expose a portion of the dielectric layer 106 where the contact hole 108 is to be formed, and the exposed portion of the dielectric layer 106 is removed in the etching process to form the contact hole 108 into the dielectric layer 106. In some exemplary examples, a dry etching process is used to etch the portion of the dielectric layer 106. In certain embodiments, after the etching process, a cleaning operation is performed to remove contaminants and particles formed during the etching process.

In the embodiment including the etch stop layer 104 formed on the substrate 102, the contact hole 108 is formed in the dielectric layer 106 and the etch stop layer 104, i.e. the contact hole 108 penetrates through the dielectric layer 106 and the etch stop layer 104 and is formed from the dielectric layer 106 through the etch stop layer 104 to the substrate 102, as shown in FIG. 2A.

Figure 2B:
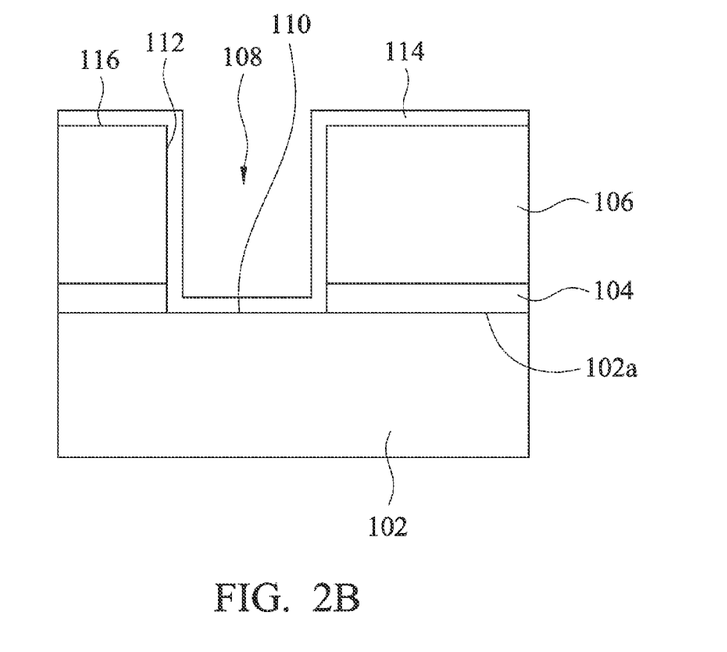

As shown in FIG. 2B, a dielectric spacer liner 114 is formed to cover the bottom 110 and the sidewall 112 of the contact hole 108. In some embodiments, the dielectric spacer liner 114 is conformally formed on the dielectric layer 106, the etch stop layer 104 and the substrate 102, and covers a surface 116 of the dielectric layer 106, and the bottom 110 and the sidewall 112 of the contact hole 108 formed in the dielectric layer 106 and the etch stop layer 104. In certain embodiments, the dielectric spacer liner 114 is formed by using a deposition method. For example, the dielectric spacer liner 114 is formed by using a CVD method. In some embodiments, the dielectric spacer liner 114 is formed from an oxide containing carbon. For example, the dielectric spacer liner 114 is formed from silicon oxycarbide.

Figure 2C:
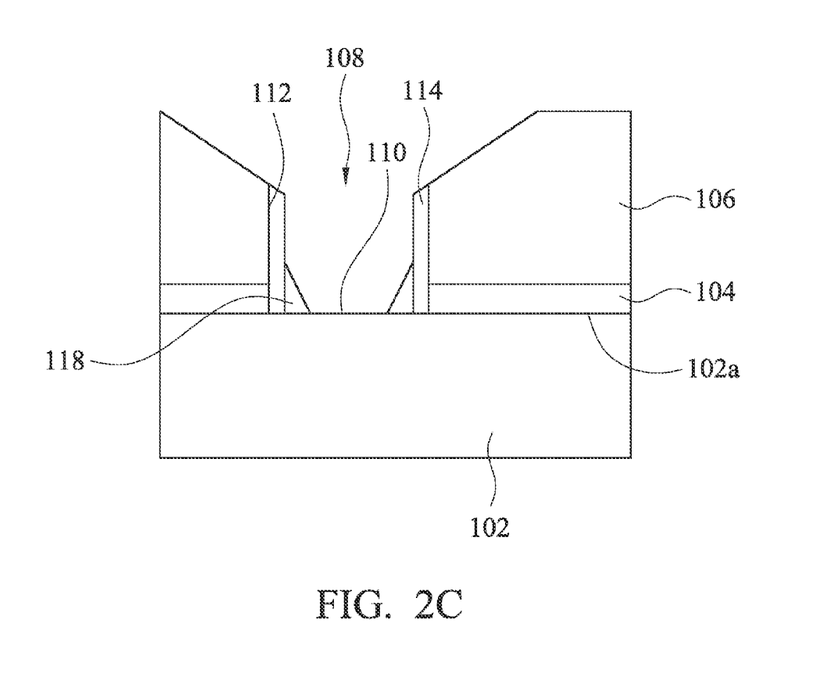

After the dielectric spacer liner 114 is formed, a portion of the dielectric spacer liner 114 is removed to expose a portion of the surface 102a of the substrate 102, as shown in FIG. 2C. In some embodiments, the portion of the dielectric spacer liner 114 is removed by a physical etching method. In some exemplary examples, the portion of the dielectric spacer liner 114 is removed by a plasma physical etching method. For example, the plasma physical etching operation of the dielectric spacer liner 114 is performed by using an argon plasma, a hydrogen plasma or a nitrogen plasma. In the operation of removing the portion of the dielectric spacer liner 114, the dielectric spacer liner 114 and the dielectric layer 106 underlying the dielectric spacer liner 114 are bombarded by the plasma, so as to remove the portion of the dielectric spacer liner 114 and a portion of the dielectric layer 106 until the portion of the surface 102a of the substrate 102 is exposed. In some exemplary examples, during the operation of removing the portion of the dielectric spacer liner 114, the other portion of the dielectric spacer liner 114 is kept to cover the sidewall 112 of the contact hole 108.

In some embodiments, as shown in FIG. 2C, in the operation of removing the portion of the dielectric spacer liner 114, a portion of the dielectric spacer liner 114 covering the bottom 110 of the contact hole 108 is bombarded and sputtered to be deposited onto the dielectric spacer liner 114 covering the sidewall 112 of the contact hole 108 adjacent to the bottom 110, so as to form a dielectric spacer 118 on the dielectric spacer liner 114 covering the sidewall 112 adjacent to the bottom 110. With the dielectric spacer liner 114 covering the sidewall 112 of the contact hole 108, the sidewall 112 can be protected in the subsequent processes, and the bottom 110 of the contact hole 108 can be shrunk. With the dielectric spacer 118 on the dielectric spacer liner 114 covering the sidewall 112 adjacent to the bottom 110, the bottom 110 of the contact hole 108 can be further shrunk.

Figure 2D:
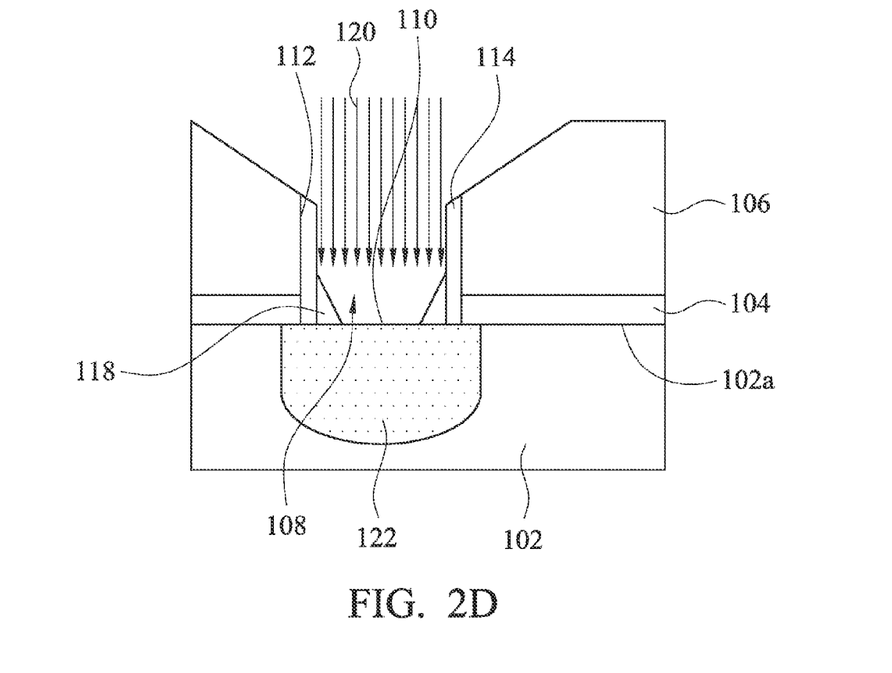
Figure 2E:
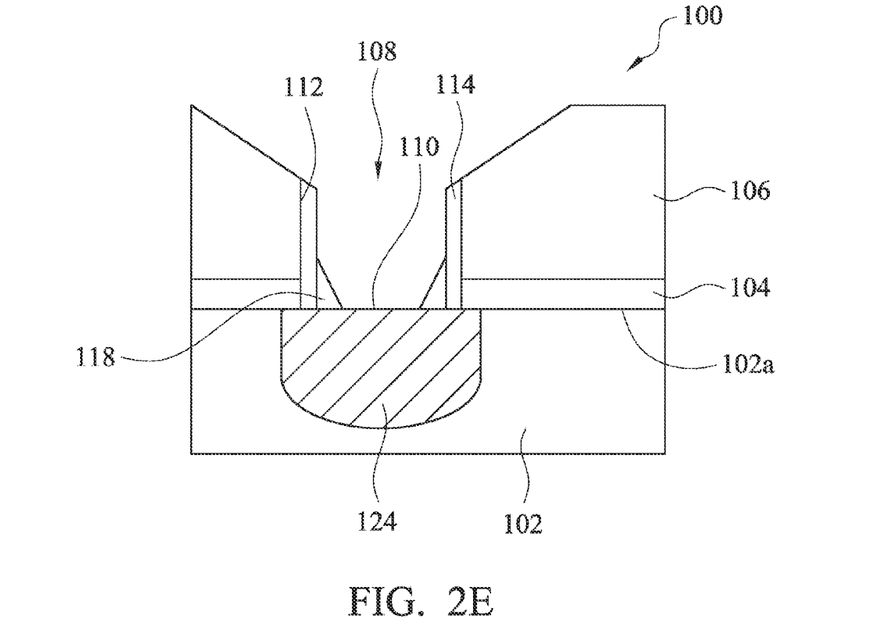

In some embodiments, after the portion of the dielectric spacer liner 114 is removed and the portion of the surface 102a of the substrate 102 is exposed, a wet cleaning operation is optionally performed to remove contaminants and particles formed during the bombardment process. Then, as shown in FIG. 2E, a metal silicide layer 124 is formed into the substrate 102 through the bottom 110 of the contact hole 108. In some embodiments, the operation of forming the metal silicide layer 124 is performed by forming an implant region 122 in the substrate 102 through the contact hole 108 and performing a silicidation operation on the implant region 122 through the contact hole 108, so as to form the metal silicide layer 124 into the substrate 102, as shown in FIG. 2D and FIG. 2E.

Referring to FIG. 2D again, the implant region 122 is formed into the substrate 102 by an implant operation 120. In the implant operation 120, dopants are implanted into the substrate 102 through the bottom 110 of the contact hole 108. The dopants are composed of metal dopants, for example. In some exemplary examples, the implant operation 120 is performed using a pre-amorphization implant method, and the implant region 122 is a pre-amorphization implant region.

With the dielectric spacer liner 114 covering the sidewall 112 of the contact hole 108, the sidewall 112 of the contact hole 108 is protected from being damaged by the dopants during the implant operation 120. Furthermore, the bottom 110 of the contact hole 108 is narrowed by the dielectric spacer liner 114 covering the sidewall 112 of the contact hole 108. Accordingly, a range of the implant operation 120 in the substrate 102 is controlled.

In the embodiment including the dielectric spacer 118 disposed on the dielectric spacer liner 114 covering the sidewall 112 adjacent to the bottom 110 of the contact hole 108, the bottom 110 of the contact hole 108 is further narrowed by the dielectric spacer 118. Accordingly, the critical dimension of the implant operation 120 in the substrate 102 is controlled and decreased.

Referring to FIG. 2E again, the metal silicide layer 124 is formed into the substrate 102 by performing the silicidation operation on the implant region 122 through the bottom 110 of the contact hole 108. In some exemplary examples, the silicidation operation includes an annealing operation, the metal silicide layer 124 is only formed in the implant region 122 including the metal dopants, in which the metal dopants directly contact silicon, and the metal silicide layer 124 is formed in the implant region 122 after the annealing operation is performed. Thus, the silicidation operation is a self-aligned silicidation operation. In certain embodiments, the metal silicide layer 124 is formed from nickel silicide.

In the silicidation operation, because the dielectric spacer liner 114 covers the sidewall 112 of the contact hole 108, the encroachment effect can be restrained. Therefore, the range of the silicidation can be limited to effectively control the critical dimension of the metal silicide layer 124. Furthermore, in the embodiment including the dielectric spacer 118 disposed on the dielectric spacer liner 114 covering the sidewall 112 adjacent to the bottom 110 of the contact hole 108, the bottom 110 of the contact hole 108 is further narrowed by the dielectric spacer 118, and the critical dimension of the implant operation 120 in the substrate 102 is decreased. Thus, the encroachment effect can be effectively restrained, and the critical dimension of the metal silicide layer 124 is well controlled.

Figure 3:
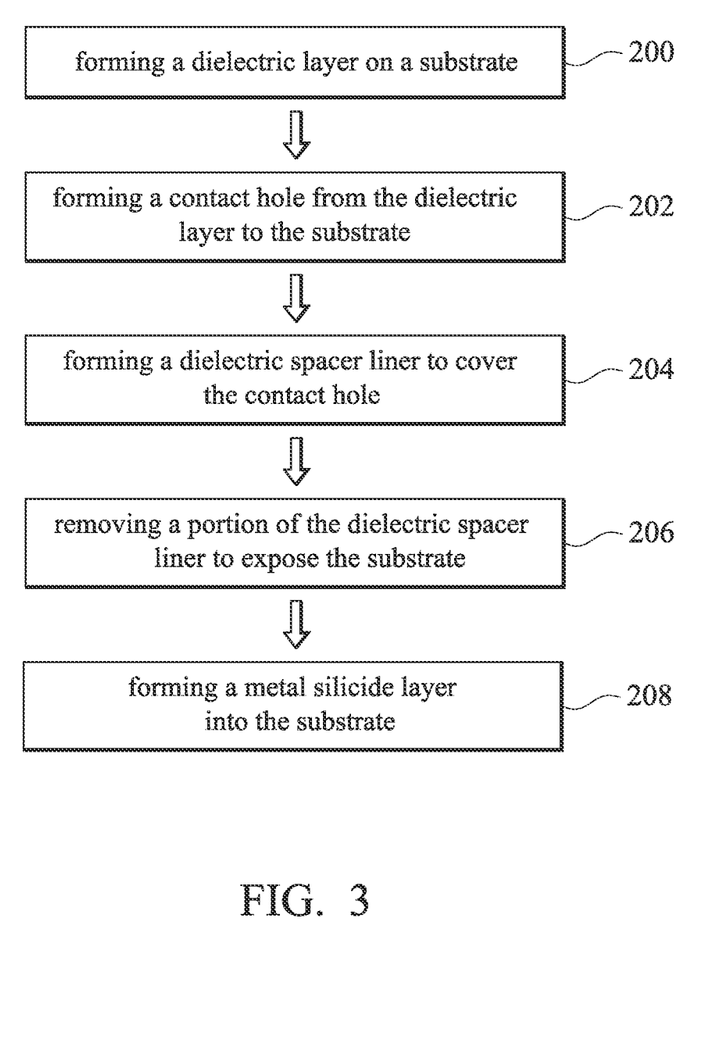
FIG. 3 is a flow chart of a method for manufacturing a semiconductor device in accordance with various embodiments.

Referring to FIG. 3 with FIG. 2A through 2E, FIG. 3 is a flow chart of a method for manufacturing a semiconductor device in accordance with various embodiments. The method begins at operation 200, where a substrate 102 is provided and a dielectric layer 106 is formed on a surface 102a of the substrate 102. In the present embodiment, the substrate 102 is a silicon substrate. In certain embodiments, an etch stop layer 104 is formed to cover the surface 102a of the substrate 102 before the dielectric layer 106 is formed, and the dielectric layer 106 is formed on the etch stop layer 104. The dielectric layer 106 and the etch stop layer 104 are formed from different materials.

At operation 202, as shown in FIG. 2A, a contact hole 108 is formed from the dielectric layer 106 to the surface 102a of the substrate 102. In some embodiments, the contact hole 108 is formed using a photolithography process and an etching process. The photolithography process is used to define a range of the contact hole 108, and the etching process is used to remove a portion of the dielectric layer 106 and a portion of the etch stop layer 104. For example, the etching process is a dry etching process. In certain embodiments, after the etching process, a cleaning operation is performed to remove contaminants and particles formed during the etching process.

At operation 204, as shown in FIG. 2B, a dielectric spacer liner 114 is formed to cover a bottom 110 and a sidewall 112 of the contact hole 108. In some embodiments, the dielectric spacer liner 114 is conformally formed on the dielectric layer 106, the etch stop layer 104 and the substrate 102, and covers the contact hole 108. In some exemplary embodiments, the dielectric spacer liner 114 is formed from an oxide containing carbon. For example, the dielectric spacer liner 114 is formed from silicon oxycarbide.

At operation 206, as shown in FIG. 2C, a portion of the dielectric spacer liner 114 is removed to expose a portion of the surface 102a of the substrate 102 by an etching method. In some embodiments, the portion of the dielectric spacer liner 114 is removed by using a physical etching operation, such as a plasma physical etching operation. For example, the plasma physical etching operation is performed by using an argon plasma, a hydrogen plasma or a nitrogen plasma. While the portion of the dielectric spacer liner 114 is removed, the other portion of the dielectric spacer liner 114 is kept to cover the sidewall 112 of the contact hole 108. In addition, a portion of the dielectric spacer liner 114 covering the bottom 110 of the contact hole 108 is sputtered to deposit onto the dielectric spacer liner 114 covering the sidewall 112 of the contact hole 108 adjacent to the bottom 110, so as to form a dielectric spacer 118 on the dielectric spacer liner 114 adjacent to the bottom 110. In some embodiments, after the portion of the dielectric spacer liner 114 is removed, a wet cleaning operation is optionally performed to remove contaminants and particles formed during the physical etching operation.

At operation 208, as shown in FIG. 2E, a metal silicide layer 124 is formed into the substrate 102 through the contact hole 108. In some embodiments, as shown in FIG. 2D and FIG. 2E, the metal silicide layer 124 is formed by forming an implant region 122 in the substrate 102 and performing a silicidation operation on the implant region 122. Referring to FIG. 2D again, the implant region 122 is formed into the substrate 102 through the bottom 110 of the contact hole 108 by an implant operation 120, such as a pre-amorphization implant operation. In the implant operation 120, dopants, such as metal dopants, are implanted into the substrate 102 through the bottom 110 of the contact hole 108. As shown in FIG. 2E, the metal silicide layer 124 is formed into the substrate 102 by performing the silicidation operation on the implant region 122 through the bottom 110 of the contact hole 108. The silicidation operation is a self-aligned silicidation operation. In some exemplary examples, the metal silicide layer 124 is formed from nickel silicide.

Figure 4:
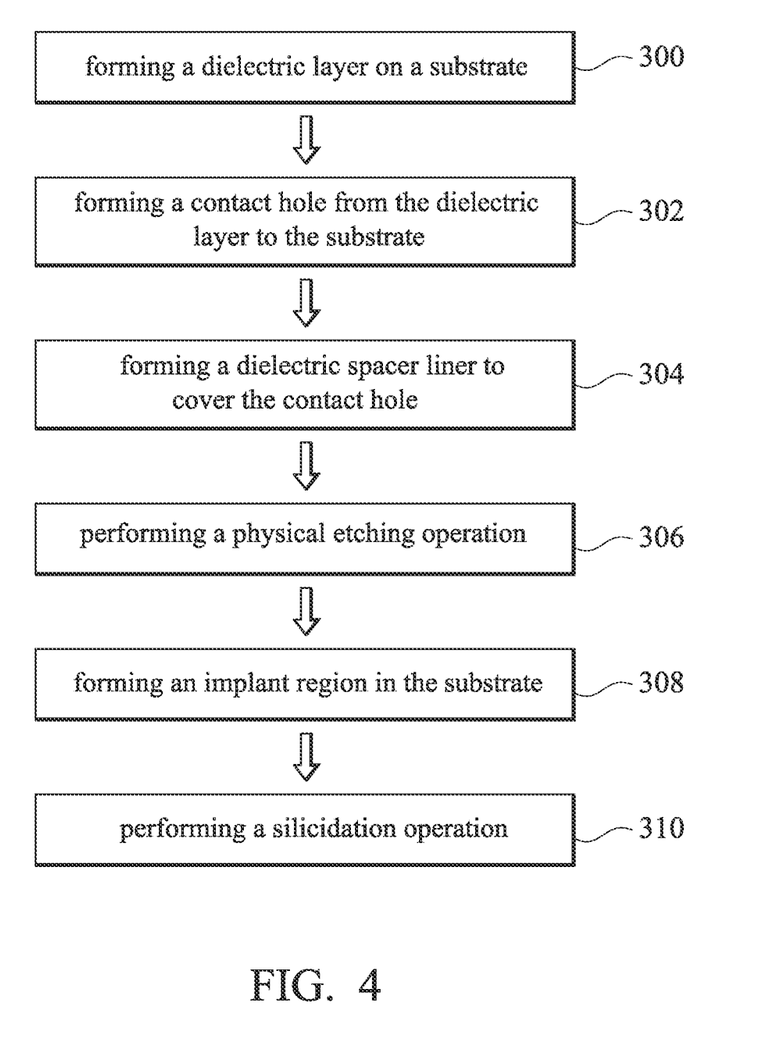
FIG. 4 is a flow chart of a method for manufacturing a semiconductor device in accordance with various embodiments.

Referring to FIG. 4 with FIG. 2A through 2E, FIG. 4 is a flow chart of a method for manufacturing a semiconductor device in accordance with various embodiments. The method begins at operation 300, where a dielectric layer 106 is formed on a surface 102a of a substrate 102. In the present embodiment, the substrate 102 is a silicon substrate. In certain embodiments, an etch stop layer 104 is formed to cover the surface 102a of the substrate 102 before the dielectric layer 106 is formed, and the dielectric layer 106 is formed on the etch stop layer 104. The dielectric layer 106 and the etch stop layer 104 are formed from different materials.

At operation 302, as shown in FIG. 2A, a contact hole 108 is formed from the dielectric layer 106 to the surface 102a of the substrate 102. In some embodiments, the contact hole 108 is formed using a photolithography process and an etching process. In some exemplary embodiments, the etching process is a dry etching process. In certain embodiments, after the etching process, a cleaning operation is performed to remove contaminants and particles formed during the etching process.

At operation 304, as shown in FIG. 2B, a dielectric spacer liner 114 is formed to cover a bottom 110 and a sidewall 112 of the contact hole 108. In some embodiments, the dielectric spacer liner 114 is conformally formed on the dielectric layer 106, the etch stop layer 104 and the substrate 102, and covers the contact hole 108. In some exemplary embodiments, the dielectric spacer liner 114 is formed from an oxide containing carbon. For example, the dielectric spacer liner 114 is formed from silicon oxycarbide.

At operation 306, as shown in FIG. 2C, a physical etching operation is performed to remove a portion of the dielectric spacer liner 114 until a portion of the surface 102a of the substrate 102 is exposed. In some embodiments, the physical etching operation is a plasma physical etching operation. For example, the plasma physical etching operation is performed by using an argon plasma, a hydrogen plasma or a nitrogen plasma. In the physical etching operation, the other portion of the dielectric spacer liner 114 is kept to cover the sidewall 112 of the contact hole 108. In addition, during the physical etching operation, a portion of the dielectric spacer liner 114 covering the bottom 110 of the contact hole 108 is sputtered to deposit onto the dielectric spacer liner 114 covering the sidewall 112 of the contact hole 108 adjacent to the bottom 110, so as to form a dielectric spacer 118 on the dielectric spacer liner 114 adjacent to the bottom 110. In some embodiments, after the physical etching operation, a wet cleaning operation is optionally performed to remove contaminants and particles formed during the physical etching operation.

At operation 308, as shown in FIG. 2D, an implant region 122 is formed into the substrate 102 through the bottom 110 of the contact hole 108 by an implant operation 120, such as a pre-amorphization implant operation. In the implant operation 120, dopants, such as metal dopants, are implanted into the substrate 102 through the bottom 110 of the contact hole 108.

At operation 310, as shown in FIG. 2E, a silicidation operation is performed on the implant region 122 through the bottom 110 of the contact hole 108 to form a metal silicide layer 124 into the substrate 102. The silicidation operation is a self-aligned silicidation operation. In some exemplary examples, the metal silicide layer 124 is formed from nickel silicide.

In accordance with an embodiment, the present disclosure discloses a method for manufacturing a semiconductor device. In this method, a dielectric layer is formed on a substrate. A contact hole is formed from the dielectric layer to the substrate. A dielectric spacer liner is formed to cover a sidewall and a bottom of the contact hole. A portion of the dielectric spacer liner is removed to expose a portion of the substrate. A metal silicide layer is formed into the substrate through the contact hole.

In accordance with another embodiment, the present disclosure discloses a method for manufacturing a semiconductor device. In this method, a dielectric layer is formed on a substrate. A contact hole is formed from the dielectric layer to the substrate. A dielectric spacer liner is formed to cover a sidewall and a bottom of the contact hole. A physical etching operation is performed to remove a portion of the dielectric spacer liner to expose a portion of the substrate. An implant region is formed in the substrate through the contact hole. A silicidation operation is performed on the implant region to form a metal silicide layer into the substrate.

In accordance with yet another embodiment, the present disclosure discloses a semiconductor device. The semiconductor device includes a dielectric layer, a dielectric spacer liner and a metal silicide layer. The dielectric layer is disposed on a substrate, in which a contact hole is formed from the dielectric layer to the substrate, and a bottom of the contact hole exposes a portion of the substrate. The dielectric spacer liner covers a sidewall of the contact hole. The metal silicide layer is disposed in the exposed portion of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    forming a dielectric layer on a substrate;
    forming a contact hole from the dielectric layer to the substrate;
    forming a dielectric spacer liner to cover a sidewall and a bottom of the contact hole;
    removing a portion of the dielectric spacer liner to expose a portion of the substrate;
    forming a dielectric spacer on a portion of a remainder of the dielectric spacer liner adjacent to the bottom of the contact hole, wherein the dielectric spacer liner is located between the dielectric layer and the dielectric spacer; and
    forming a metal silicide layer into the substrate through the contact hole.

2. The method of claim 1, wherein an operation of forming the dielectric spacer liner comprises forming the dielectric spacer liner from an oxide containing carbon.

3. The method of claim 1, wherein an operation of removing the portion of the dielectric spacer liner is performed using a plasma physical etching method.

4. The method of claim 1, wherein an operation of removing the portion of the dielectric spacer liner is performed using an argon plasma, a hydrogen plasma or a nitrogen plasma.

5. The method of claim 1, wherein an operation of removing the portion of the dielectric spacer liner is performed to keep the sidewall of the contact hole being covered by another portion of the dielectric spacer liner.

6. The method of claim 1, wherein the dielectric spacer is formed by sputtering a portion of the dielectric spacer liner covering the bottom of the contact hole to deposit onto the dielectric spacer liner covering the sidewall of the contact hole adjacent to the bottom of the contact hole.

7. The method of claim 1, wherein an operation of forming the metal silicide layer comprises forming the metal silicide layer from nickel silicide.

8. The method of claim 1, wherein an operation of forming the metal silicide layer comprises:
    performing a pre-amorphization implant operation on the substrate through the contact hole to form a pre-amorphization implant region in the substrate; and
    performing a self-aligned silicidation operation on the pre-amorphization implant region.

9. The method of claim 1, wherein an operation of forming the contact hole is performed to remove a portion of the dielectric layer using a dry etching process.

10. The method of claim 1, wherein an operation of forming the dielectric spacer liner comprises conformally forming the dielectric spacer liner on the dielectric layer.

11. The method of claim 1, wherein an operation of forming the dielectric spacer liner comprises forming the dielectric spacer liner from silicon oxycarbide.

12. A method for manufacturing a semiconductor device, the method comprising:

forming a dielectric layer on a substrate;

forming a contact hole from the dielectric layer to the substrate;

forming a dielectric spacer liner to cover a sidewall and a bottom of the contact hole;

performing a physical etching operation to remove a portion of the dielectric spacer liner to expose a portion of the substrate;

forming a dielectric spacer on a portion of a remainder of the dielectric spacer liner adjacent to the bottom of the contact hole, wherein the dielectric spacer liner is located between the dielectric layer and the dielectric spacer;

forming an implant region in the substrate through the contact hole; and performing a silicidation operation on the implant region to form a metal silicide layer into the substrate.

13. The method of claim 12, wherein an operation of forming the dielectric spacer liner comprises forming the dielectric spacer liner from an oxide containing carbon.

14. The method of claim 12, wherein the physical etching operation is performed using a plasma method.

15. The method of claim 12, wherein the physical etching operation is performed using an argon plasma, a hydrogen plasma or a nitrogen plasma.

16. The method of claim 12, wherein the physical etching operation is performed to keep the sidewall of the contact hole being covered by another portion of the dielectric spacer liner.

17. The method of claim 12, wherein the dielectric spacer is formed by sputtering a portion of the dielectric spacer liner covering the bottom of the contact hole to deposit onto the dielectric spacer liner covering the sidewall of the contact hole adjacent to the bottom of the contact hole.

18. The method of claim 17, wherein an operation of forming the implant region is performed using a pre-amorphization implant method.

19. The method of claim 12, wherein the silicidation operation is performed using a self-aligned silicidation method.

20. The method of claim 12, wherein the silicidation operation comprises forming the metal silicide layer from nickel silicide.

* * * * *